United States Patent
Yoshikawa

(10) Patent No.: US 8,301,093 B2
(45) Date of Patent: Oct. 30, 2012

(54) RECEIVER CIRCUIT AND DATA TRANSMISSION SYSTEM

(75) Inventor: Takefumi Yoshikawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 424 days.

(21) Appl. No.: 12/601,433

(22) PCT Filed: Feb. 26, 2008

(86) PCT No.: PCT/JP2008/000352
§ 371 (c)(1),
(2), (4) Date: Nov. 23, 2009

(87) PCT Pub. No.: WO2008/149480
PCT Pub. Date: Dec. 11, 2008

(65) Prior Publication Data
US 2010/0167678 A1    Jul. 1, 2010

(30) Foreign Application Priority Data

Jun. 5, 2007    (JP) .................................. 2007-148905

(51) Int. Cl.
*H04B 3/36*    (2006.01)
*H04B 5/00*    (2006.01)
*H03D 7/16*    (2006.01)
*H04B 1/28*    (2006.01)

(52) U.S. Cl. ......... 455/130; 455/14; 455/41.1; 455/131; 455/282; 455/333; 326/82; 326/115

(58) Field of Classification Search .................... 455/14, 455/15, 41.1, 66.1, 282, 296, 334, 131, 333; 326/82, 86, 115

See application file for complete search history.

(56) References Cited

U.S. PATENT DOCUMENTS

| | | | | |
|---|---|---|---|---|
| 5,811,984 | A * | 9/1998 | Long et al. | 326/30 |
| 7,298,172 | B2 * | 11/2007 | Shibata et al. | 326/82 |
| 7,408,385 | B2 * | 8/2008 | Takamuku | 326/82 |
| 7,535,257 | B2 * | 5/2009 | Shibata et al. | 326/82 |
| 7,548,094 | B2 * | 6/2009 | Shepard et al. | 326/82 |
| 7,984,321 | B2 * | 7/2011 | Shibata et al. | 713/600 |
| 8,026,891 | B2 * | 9/2011 | Kim et al. | 345/100 |
| 2005/0036561 | A1 * | 2/2005 | Murata et al. | 375/257 |
| 2005/0088218 | A1 | 4/2005 | Shibata et al. | |
| 2005/0147178 | A1 * | 7/2005 | Kikuchi | 375/288 |
| 2006/0244477 | A1 | 11/2006 | Wang et al. | |
| 2007/0164883 | A1 * | 7/2007 | Furtner | 341/126 |

FOREIGN PATENT DOCUMENTS

JP    03-283741    12/1991

(Continued)

*Primary Examiner* — Simon Nguyen

(74) *Attorney, Agent, or Firm* — McDermott Will & Emery LLP

(57) ABSTRACT

A receiver circuit which can suppress a voltage amplitude appearing on a transmission line. The receiver circuit, coupled to a first and a second transmission lines which transmit information by using currents, includes a first and a second current sources, a first and a second conversion sections which convert currents which flow respectively therein to voltages, a first transistor whose source is coupled to the first current source and to the first transmission line, and whose drain is coupled to the first conversion section, and a second transistor whose source is coupled to the second current source and to the second transmission line, and whose drain is coupled to the second conversion section. The gate and the drain of the first transistor are respectively coupled to the drain and the gate of the second transistor.

17 Claims, 19 Drawing Sheets

FOREIGN PATENT DOCUMENTS

| | | |
|---|---|---|
| JP | 8-162942 | 6/1996 |
| JP | 2002-330063 | 11/2002 |
| JP | 2005-64589 | 3/2005 |
| JP | 2005-142872 | 6/2005 |
| JP | 2005-236930 | 9/2005 |

* cited by examiner

|  | IDR | IDRB |
|---|---|---|
| DAT=0 | Id or 2*Id | 0 |
| DAT=1 | 0 | Id or 2*Id |

FIG. 13

|  | IDR | IDRB |
|---|---|---|
| DAT=0 | Id or 0 | 0 or Id |
| DAT=1 | Id + $\Delta$I or 0 | 0 or Id + $\Delta$I |

# RECEIVER CIRCUIT AND DATA TRANSMISSION SYSTEM

RELATED APPLICATIONS

This application is the U.S. National Phase under 35 U.S.C. §371 of International Application No. PCT/JP2008/000352, filed on Feb. 26, 2008, which in turn claims the benefit of Japanese Application No. 2007-148905, filed on Jun. 5, 2007, the disclosures of which Applications are incorporated by reference herein.

TECHNICAL FIELD

The present invention relates to data transmission systems which transmit data between transmitter circuits and receiver circuits.

BACKGROUND ART

In a liquid crystal display panel, etc., in order to suppress electromagnetic interference (EMI) during data transmission, current-mode data transmission, in which a current corresponding to a data signal is transmitted and received, may be adopted.

An example of the current-mode data transmission described in Patent Document 1 is described below. A transmission line is driven by a transistor in a transmitter circuit connected to one end thereof. In a receiver circuit, a current-to-voltage conversion device (a diode-connected transistor) and a transistor which serves as a current source are connected in series, and the other end of the transmission line is connected to a node therebetween.

A drive current Id which flows into the transmitter circuit causes a bias current Ib of the current-to-voltage conversion device in the receiver circuit to change. The bias current Ib undergoes current-to-voltage conversion by the current-to-voltage conversion device, and is input to a comparator as an internal voltage signal. The other transmission line is similarly configured, and a transmission data signal is derived from a difference of the two voltages which are input to the comparator.

Since, in this transmission scheme, a voltage change (Id*gm) determined by the drive current Id and a transconductance gm of the current-to-voltage conversion device appears as a voltage amplitude between the transmission lines, the voltage amplitude becomes much smaller than that of digital transmission (the amplitude is approximately 3.3 V) by a general CMOS (complementary metal oxide semiconductor) circuit, thereby enabling to contribute to a reduction of EMI.

PATENT DOCUMENT 1: Japanese Patent Publication No. 2005-236930

DISCLOSURE OF THE INVENTION

Technical Problem

However, in an interface which performs such current-mode data transmission, if the drive current Id and/or the bias current Ib are increased in order to raise a transmission rate, then the voltage amplitude of a transmitted signal also increases, thereby causing EMI to increase. This created a problem that raising a transmission rate was difficult.

In particular, in the field of mobile phones, in line with an increase of transmission rate, there is a demand to perform high-speed serial data transmission between an analog front-end LSI and a baseband LSI, and a reduction of EMI is also demanded. That is, it is desired that while a transmission rate required for mobile phones (more than or equal to 300 Mbps) be achieved, an interface with low power consumption and reduced EMI be implemented.

In order to achieve improvements of communication rate and increases of the number of pixels of cameras in mobile phones, it is required to raise the transmission rate. An increase of a speed of current-mode data transmission requires:

Development of broadband current-to-voltage converters

Improvement of duty cycle accuracy of clocks and data signals

Optimization of phase relationships between clocks and data signals

Although development of a broadband current-to-voltage converter is basically achievable by increasing the current consumption, an increase of the current consumption is hard to be accepted particularly in the field of mobile phones.

It is an object of the present invention to provide a receiver circuit and a data transmission system which are configured to suppress a voltage amplitude which appears on a transmission line which transmits information by using a current.

It is another object of the present invention to increase a data transmission rate without largely increasing the current consumption.

Solution to the Problem

A receiver circuit in accordance with an aspect of the present invention is a receiver circuit coupled to a first and a second transmission lines which transmit information by using currents, which includes a first and a second current sources, a first and a second conversion sections which convert currents which flow respectively therein to voltages, a first transistor whose source is coupled to the first current source and to the first transmission line, and whose drain is coupled to the first conversion section, and a second transistor whose source is coupled to the second current source and to the second transmission line, and whose drain is coupled to the second conversion section. The gate and the drain of the first transistor are respectively coupled to the drain and the gate of the second transistor.

According to the above configuration, since feedback is applied to the first and the second transistors, the voltage amplitudes of the transmission lines can be suppressed.

Another receiver circuit in accordance with an aspect of the present invention is a receiver circuit coupled to a transmission line which transmits information by using a current, which includes a first and a second current sources, a first and a second conversion sections which convert currents which flow respectively therein to voltages, a first transistor whose source is coupled to the first current source, and whose drain is coupled to the first conversion section, and a second transistor whose source is coupled to the second current source, and whose drain is coupled to the second conversion section. The gate and the drain of the first transistor are respectively coupled to the drain and the gate of the second transistor, and the transmission line is coupled to the source of either the first or the second transistor.

According to the above configuration, since data transmission is performed using a single transmission line, not only can the voltage amplitude of the transmission line be suppressed, but also the configuration of the data transmission system is simplified.

Additionally, a data transmission system in accordance with an aspect of the present invention includes a transmitter circuit which drive a first and a second transmission lines with currents, and a receiver circuit coupled to the first and the second transmission lines. The transmitter circuit superimposes a data signal and a clock on the currents which flow through the first and the second transmission lines, and transmits the superimposed data signal and clock. The receiver circuit includes a first and a second current sources, a first and a second conversion sections which convert currents which flow respectively therein to voltages, a first transistor whose source is coupled to the first current source and to the first transmission line, and whose drain is coupled to the first conversion section, and a second transistor whose source is coupled to the second current source and to the second transmission line, and whose drain is coupled to the second conversion section. The gate and the drain of the first transistor are respectively coupled to the drain and the gate of the second transistor.

According to the above configuration, since the voltage amplitudes of the first and the second transmission lines do not change basically regardless of the amount of drive current, transmitting information by changing the amount of current is facilitated, thereby allowing a data signal and a clock to be superimposed, and then transmitted. Moreover, a clock wire and a terminal for a clock are no longer required.

Advantages of the Invention

According to the present invention, a voltage amplitude of a transmission line can be suppressed regardless of whether a drive current is large or small. Thus, lower power consumption, higher transmission rate, and suppression of EMI can be pursued. Moreover, by superimposing a data signal and a clock and then transmitting them, the clock can be recovered without using a complex clock recovery system.

BRIEF DESCRIPTION OF THE DRAWINGS

FIG. 13 is a figure showing a relationship between the value of a data signal and the drive currents in the data transmission system of FIG. 9.

FIG. 19($b$) is a graph illustrating the output potentials OUTM and OUTP of the amplifier of FIG. 14.

FIGS. 20($c$) and 20($d$) are graphs respectively illustrating the data signal PDAT output from the duty-cycle correction circuit of FIG. 9, and the clock PCLK output from the delay adjustment circuit.

DESCRIPTION OF REFERENCE CHARACTERS

| | |
|---|---|
| 4, 6 | Transmission Line |
| 10, 210 | Transmitter Circuit |
| 20, 220 | Receiver Circuit |
| 22, 222 | Current-to-Voltage Converter |
| 23, 223 | Amplifier |
| 24, 224 | Comparator |
| 31 | Transistor (First Current Source) |
| 32 | Transistor (Second Current Source) |
| 33 | First Transistor |
| 34 | Second Transistor |
| 35 | Transistor (First Conversion Section) |
| 36 | Transistor (Second Conversion Section) |
| 232 | Duty-Cycle Correction Circuit |
| 233 | Delay Adjustment Circuit |

BEST MODE FOR CARRYING OUT THE INVENTION

Example embodiments of the present invention are described below in detail with reference to the drawings. Note that the example embodiments described below are not intended to limit the present invention, and that the entire configurations described in the example embodiments are not necessarily indispensable as solutions of the present invention.

First Embodiment

Figure 1:
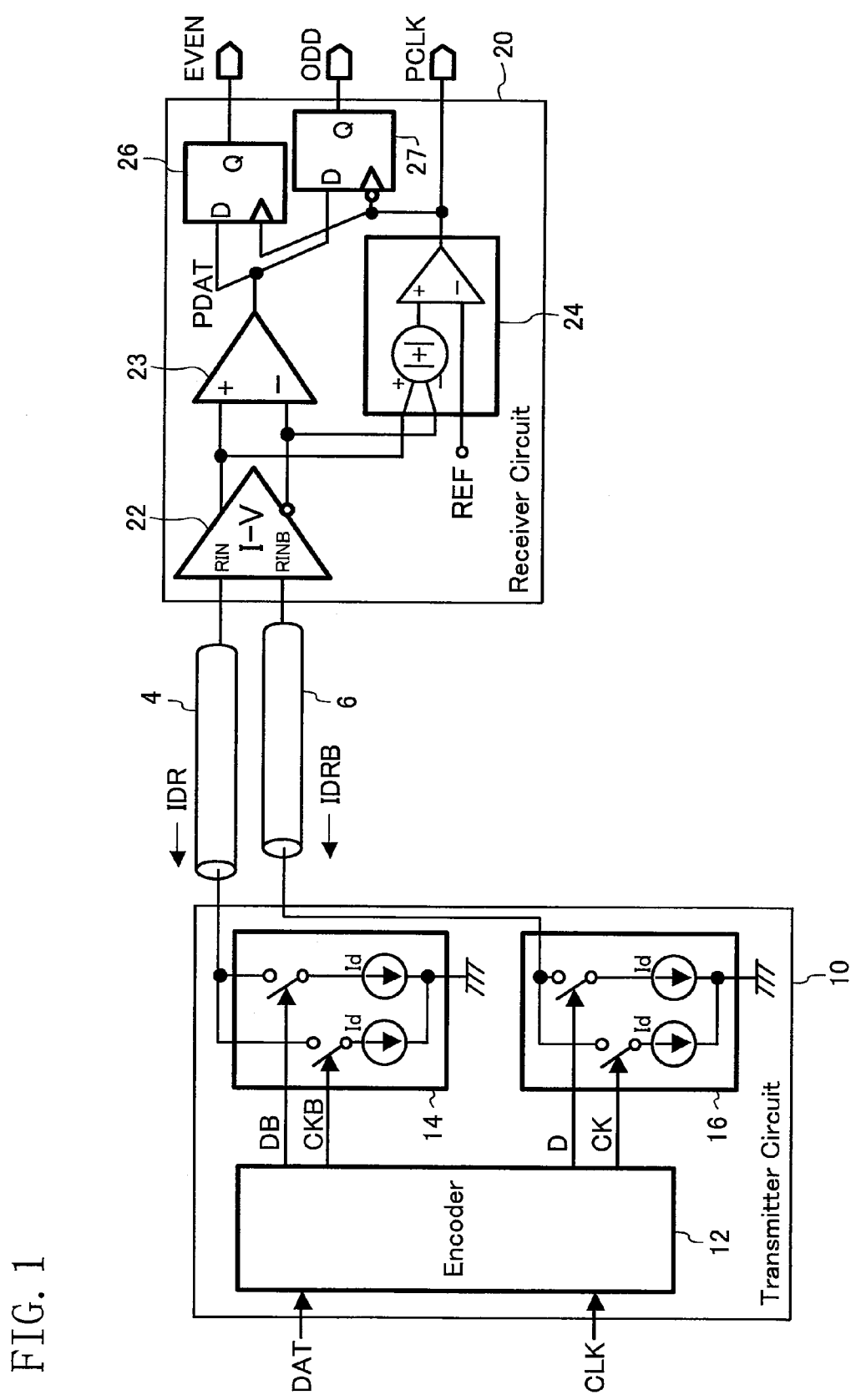
FIG. 1 is a block diagram illustrating a configuration of a data transmission system in accordance with the first embodiment of the present invention.

FIG. 1 is a block diagram illustrating a configuration of a data transmission system in accordance with the first embodiment of the present invention. The data transmission system of FIG. 1 includes a transmitter circuit 10 which transmits data, transmission lines 4 and 6 which transmit the transmitted data, and a receiver circuit 20 which receives the data transmitted through the transmission lines 4 and 6.

The transmitter circuit 10 includes an encoder 12, a positive driver 14, and a negative driver 16. The encoder 12 generates and outputs control signals which control the drivers 14 and 16, according to a data signal DAT and a clock CLK which were input. The drivers 14 and 16 each includes two current sources each of which provides a current Id. The drivers 14 and 16 respectively control drive currents IDR and IDRB which flow through the transmission lines 4 and 6, according to the control signals output from the encoder 12. That is, the transmitter circuit 10 controls the drive currents IDR and IDRB to be one of three levels (0, Id, and 2*Id) according to the data signal DAT and the clock CLK.

Figure 2:
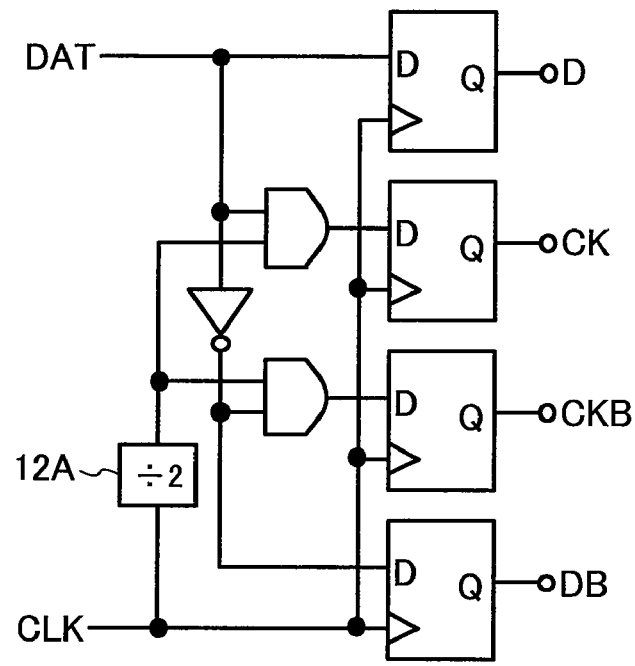
FIG. 2 is a circuit diagram illustrating a configuration of the encoder of FIG. 1.

FIG. 2 is a circuit diagram illustrating a configuration of the encoder 12 of FIG. 1. The encoder 12 includes a frequency divider 12A, four D flip-flips, and logical gates. The encoder 12 outputs the data signal DAT and an inverted signal thereof as control signals D and DB, respectively. The frequency divider 12A divides the frequency of the clock CLK by two, and thereby converting the clock CLK to a signal which alternates on each pulse of the clock CLK. When the signal of which frequency is divided by two is in an "H" (high potential) state, the encoder 12 outputs the data signal DAT and the inverted signal thereof as control signals CK and CKB, respectively. The encoder 12 outputs the control signals D, DB, CK, and CKB in synchronization with the clock CLK.

Figure 3:
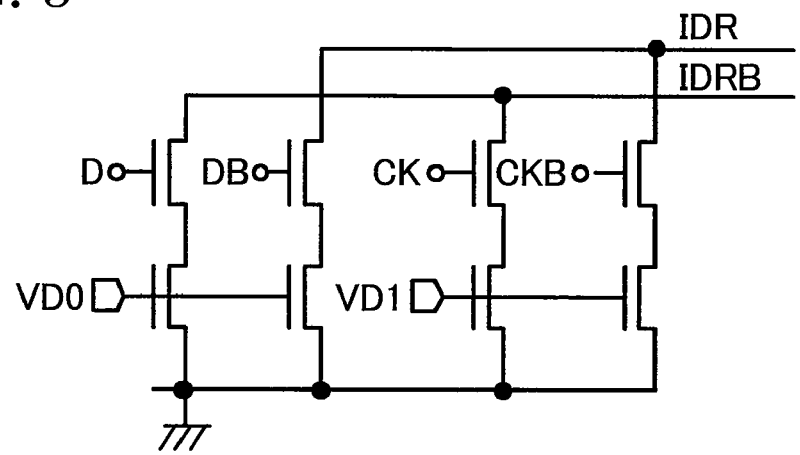
FIG. 3 is a circuit diagram collectively illustrating configurations of the two drivers of FIG. 1.

FIG. 3 is a circuit diagram collectively illustrating configurations of the two drivers 14 and 16 of FIG. 1. The drivers 14 and 16 each includes two circuits each of which is configured with two NMOS transistors coupled in series. In order that the current Id will flow when the control signal D or DB is in an "H" state, a bias potential VD0 is applied to the transistor coupled in series with the transistor to which the control signal D or DB is input.

In addition, in order that the current Id will flow when the control signal CK or CKB is in an "H" state, a bias potential VD1 is applied to the transistor coupled in series with the transistor to which the control signal CK or CKB is input. That is, the amount of the current Id can be controlled by the bias potentials VD0 and VD1.

Figure 4:
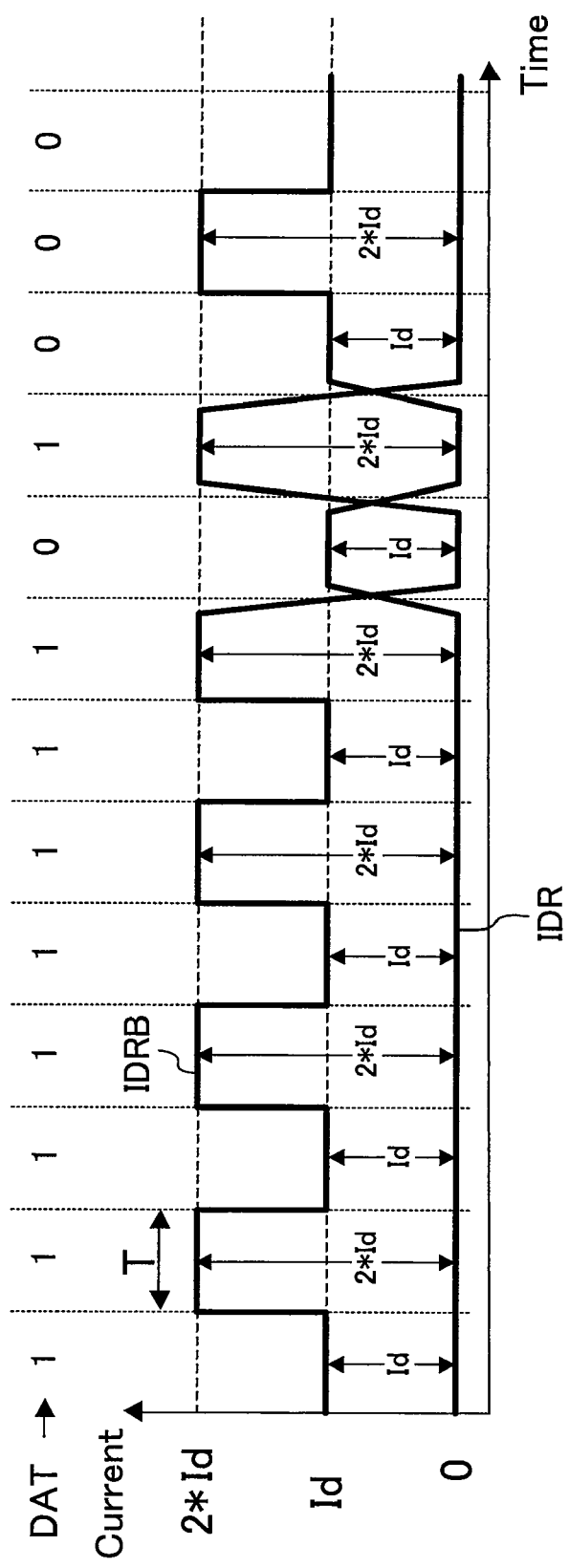
FIG. 4 is a graph illustrating an example of the drive currents which flow through the transmission lines in the data transmission system of FIG. 1.
Figures 5, 6:
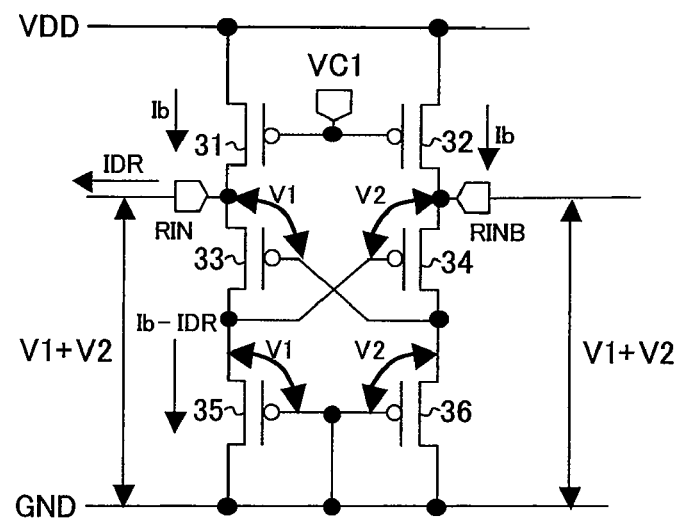
FIG. 5 is a figure showing a relationship between the value of a data signal and the drive currents in the data transmission system of FIG. 1.
FIG. 6 is a circuit diagram illustrating an example configuration of a main portion of the I-V converter of FIG. 1.

FIG. 4 is a graph illustrating an example of the drive currents IDR and IDRB which flow through the transmission lines 4 and 6 in the data transmission system of FIG. 1. FIG. 5 is a figure showing a relationship between the value of the data signal DAT and the drive currents IDR and IDRB in the data transmission system of FIG. 1. When the data signal DAT=1, the drive current IDRB flows, and when the data signal DAT=0, the drive current IDR flows.

In addition, the amount of current which flows as the drive current IDR or IDRB alternates between Id and 2*Id every period (a time period which corresponds to 1 bit) T of the clock CLK. That is, the difference of the amounts between the drive current IDR and the drive current IDRB becomes Id and 2*Id alternately. This is why a signal obtained by dividing the clock CLK by two is used in the encoder 12. As shown in FIG. 4, since the data signal and the clock are superimposed on the drive currents IDR and IDRB, which are transmitted through the transmission lines 4 and 6, the clock can be recovered in the receiver circuit 20.

The receiver circuit 20 of FIG. 1 includes a current-to-voltage converter (I-V converter) 22, an amplifier 23 as a data recovery circuit, a comparator 24 as a clock recovery circuit, and D flip-flops 26 and 27. The I-V converter 22 converts the drive currents IDR and IDRB to potentials and outputs them, respectively. The amplifier 23 amplifies a potential difference between the outputs of the I-V converter 22, and outputs it as a data signal PDAT.

The comparator 24 compares an absolute value of the potential difference between the outputs of the I-V converter 22 with a reference voltage REF, and outputs the comparison result as a clock PCLK. The D flip-flops 26 and 27 constitute a serial-to-parallel converter. The D flip-flops 26 and 27 latch the data signal PDAT on a rising edge and a falling edge of the clock PCLK, respectively, and output them as data signals EVEN and ODD.

FIG. 6 is a circuit diagram illustrating an example configuration of a main portion of the I-V converter 22 of FIG. 1. The circuit of FIG. 6 includes PMOS (p-channel metal oxide semiconductor) transistors 31, 32, 33, 34, 35, and 36.

The transistors 31 and 32 respectively constitute a first and a second current sources, and the transistors 35 and 36 respectively constitute a first and a second conversion sections. The gates of the transistors 31 and 32 are biased to a predetermined potential VC1. The gate and the drain of the transistor 33 are coupled with the drain and the gate of the transistor 34, respectively. The transistors 33 to 36 are all identical in size.

In a state where no data signal is being transmitted, the transistors 33 to 36 are biased by a bias current Ib from the transistors 31 and 32. When the transmission line 4 is driven by the transmitter circuit 10, and a drive current IDR flows, the bias currents of the transistors 33 and 35 become Ib-IDR. Since the transistors 33 to 36 operate within a saturation region, and are identical in size, source-to-gate voltages of the transistors 33 and 35 are basically a same voltage V1.

Meanwhile, when the transmission line 6 is driven and a drive current IDRB flows, the bias currents of the transistors 34 and 36 become Ib-IDRB. Since the bias currents are identical also in the transistors 34 and 36, source-to-gate voltages are basically a same voltage V2.

Here, since gates of the transistor 33 and the transistor 34 are cross-coupled to their respective drains, the potentials of the two differential input terminals RN and RINB of the circuit of FIG. 6 are a same potential (V1+V2). In other words, the potentials of the differential input terminals RN and RINB do not change regardless of the existence or non-existence of the drive currents IDR and IDRB. That is, even if the drive current IDR or IDRB is increased, no change will basically occur in the potential of the transmission line 4 or 6.

More details on this topic are described below. For example, when a drive current IDR causes the bias current of the transistor 35 to increase, and the drain voltage of the transistor 33 to rise, the gate voltage of the transistor 34 also rises, thereby causing its drain voltage to fall, and the gate voltage of the transistor 33 to fall. That is, in the transistor 33, when its drain voltage rises, the gate voltage falls.

If the transistor 33 is a PMOS transistor, even if the source-to-drain voltage becomes small, a fall of the gate voltage causes the amount of current to increase. If a circuit similar to one shown in FIG. 6 is configured by NMOS (n-channel metal oxide semiconductor) transistors, even if the source-to-drain voltage of the transistor 33 becomes large, a fall of the gate voltage causes the amount of current to decrease. That is, in either cases of PMOS transistors and NMOS transistors, the transistors 33 and 34 exhibit a characteristic as negative resistance.

As described above, even if a change in the drive current IDR or IDRB causes the drain voltage of the transistor 33 or 34 to change, since the gate voltage of the transistor 33 or 34 changes so as to accept the change, the source voltage of the transistor 33 or 34 is difficult to change. That is, even if the drive current IDR or IDRB changes, the variation of the potential (voltage amplitude) of the transmission line is controlled to be very small.

The transistors 35 and 36 are both diode-connected, and each converts a current flowing therethrough to a drain-to-source voltage. In cooperation with the cross-coupled transistors 33 and 34, the transistors 35 and 36 suppress changes in the voltages of the input terminals RIN and RINB.

Between a supply voltage VDD and a ground GND, a circuit in which only the transistor 31 as a current source, the transistor 33 which is cross-coupled, and the transistor 35 which performs a current-to-voltage conversion are coupled in series, and a circuit in which only the transistors 32, 34, and 36 are coupled in series are coupled. Since no other devices are required, a reduction of the supply voltage can be achieved.

In addition, since the transistors 35 and 36 are diode-connected and always operate in their saturation regions, it is sufficient to design so that the transistors 31 to 34 will operate in their saturation regions. This is easy to design, and a reduction of a supply voltage is also easy. That is, the circuit of FIG. 6 has a configuration which is very suitable for voltage reduction, thereby provides an advantage that a reduction of power consumption is easier to achieve.

Next, an AC analysis will be attempted. Assume that the transconductances of the transistors 33, 34, 35, and 36 are gm3, gm4, gm5, and gm6, respectively. Representing a drive current as ΔI, the voltage amplitude ΔV of the transmission line 4 or 6 is expressed as follows:

$$\Delta V = (1/gm3)*(\Delta I - gm3*\Delta I/gm6)$$
$$= (\Delta I/gm3)*(1 - gm3/gm6)$$

And, the input impedance Zin of the circuit of FIG. 6 is expressed as follows:

$$Zin = |\Delta V/\Delta I|$$
$$= |1/gm3 - 1/gm6|$$
$$= (= |1/gm4 - 1/gm5|)$$

That is, if, in the transistors 33 to 36, the bias currents and the sizes are set to the same values and the values of the transconductances gm3 to gm6 are made identical, the voltage amplitude ΔV of the transmission line 4 or 6 can be minimized, and then, the input impedance Zin of the circuit of FIG. 6 can be minimized as well. That is, minimization of the input impedance allows for an interface having a suppressed voltage amplitude, and eliminates a need for terminal resistors.

Thus, since with the circuit of FIG. 6, a voltage amplitude of a transmission line can be made small regardless of the amount of current, the data transmission system of FIG. 1 is configured to transmit the clock by whether the current is large or small, as shown in FIG. 4.

Figure 7:
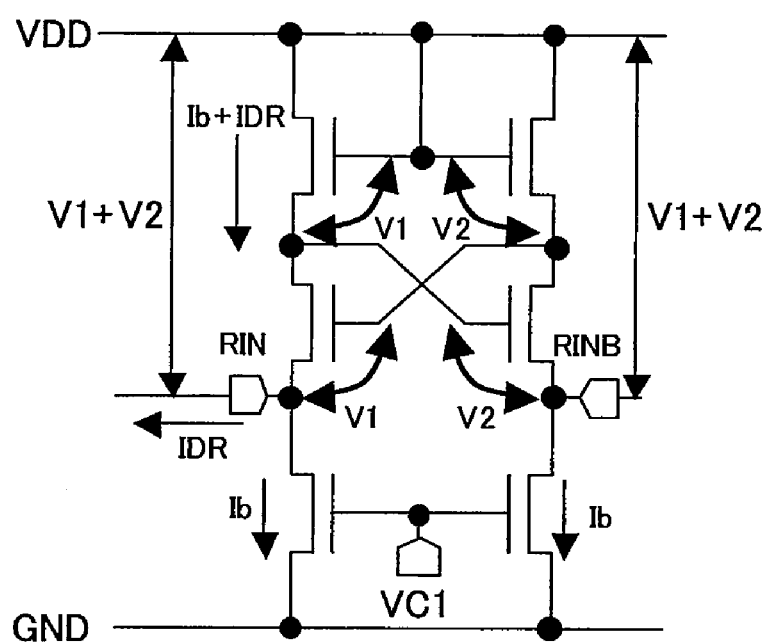
FIG. 7 is a circuit diagram illustrating an example variation of the circuit of FIG. 6.

FIG. 7 is a circuit diagram illustrating an example variation of the circuit of FIG. 6. The circuit of FIG. 7, in which the PMOS transistors 31 to 36 in the circuit of FIG. 6 are replaced with NMOS transistors, is configured to operate similarly to the circuit of FIG. 6. Since the operation thereof can be described in much the same manner as that of the circuit of FIG. 6, the explanation will be omitted.

Note that, in the circuits of FIGS. 6 and 7, resistors may be used instead of the transistors 35 and 36.

Figure 8:
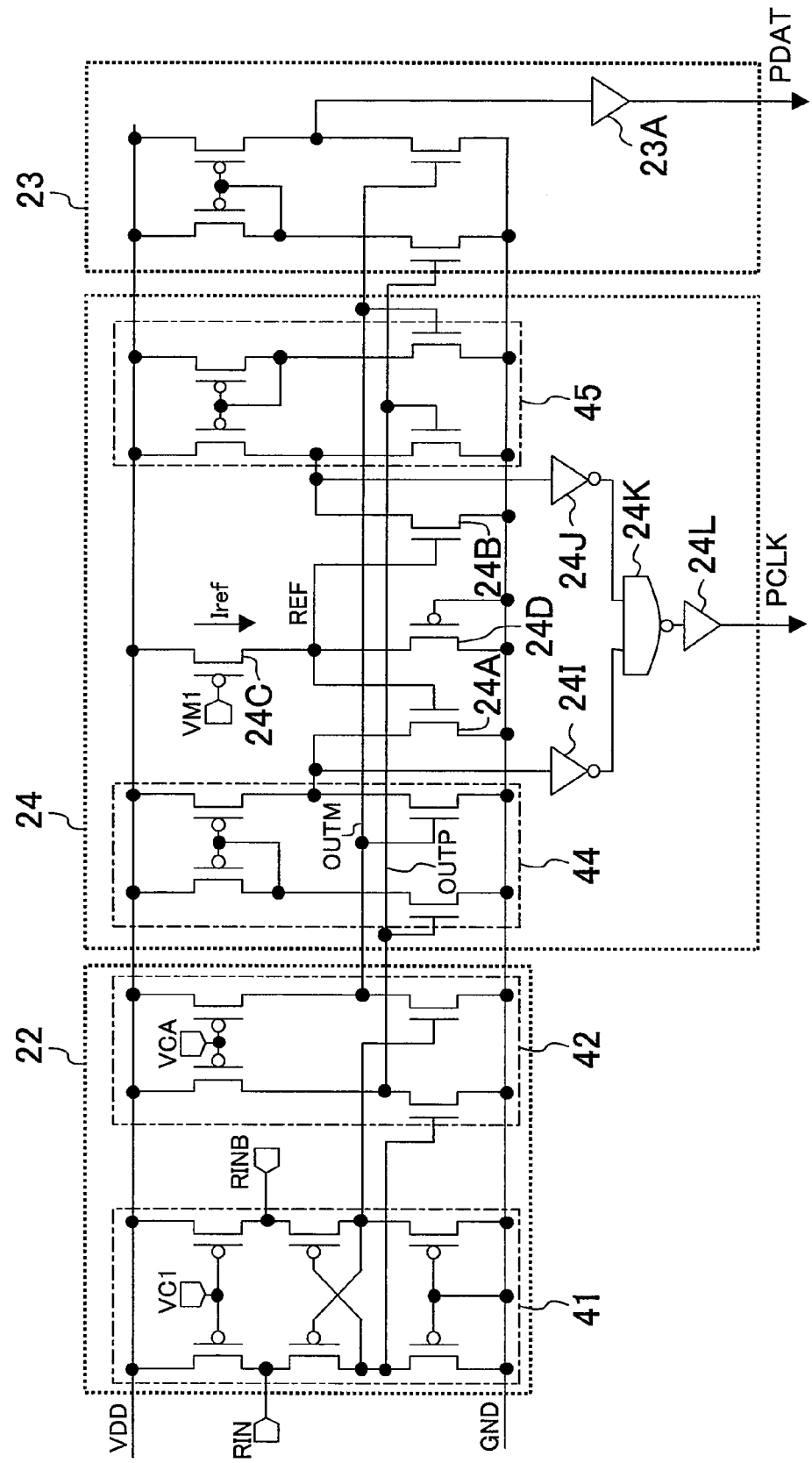
FIG. 8 is a circuit diagram illustrating an example configuration of a main portion of the receiver circuit of FIG. 1.

FIG. 8 is a circuit diagram illustrating an example configuration of a main portion of the receiver circuit 20 of FIG. 1. The circuit of FIG. 8 includes the I-V converter 22, the amplifier 23, and the comparator 24 of FIG. 1. The I-V converter 22 includes an I-V conversion section 41 and an amplifier 42. The I-V conversion section 41 is the circuit of FIG. 6, and converts the drive currents IDR and IDRB to potentials, respectively, and outputs them.

The amplifier 42 amplifies a potential difference between the potentials which are output from the I-V conversion section 41, and outputs potentials OUTP and OUTM obtained to the amplifier 23 and the comparator 24. The amplifier 23 amplifies a potential difference between the potentials OUTP and OUTM, and outputs its result via a buffer 23A as a data signal PDAT. The data signal PDAT will have a value depending on the relationship of the magnitudes between the potentials OUTP and OUTM.

The comparator 24 includes complementary comparison circuits 44 and 45, inverters 24I and 24J, a NAND gate 24K, a buffer 24L, NMOS transistors 24A and 24B, and PMOS transistors 24C and 24D. In the comparator 24, the transistor 24C to which a bias potential VM1 is applied generates a reference current Iref, and the diode-connected transistor 24D to which the reference current Iref is applied generates a reference voltage REF. The transistors 24A and 24B for voltage-to-current conversion convert the reference voltage REF to offset currents, and provide them to the comparison circuits 44 and 45, respectively.

The comparison circuits 44 and 45 compare the applied offset currents with currents corresponding to a potential difference between the potentials OUTP and OUTM which are output from the I-V converter 22, and output signals which indicate whether the potential difference is or is not larger than a predetermined value to the inverters 24I and 24J, respectively. The inverters 24I and 24J and the NAND gate 24K constitute a logical OR circuit. The NAND gate 24K outputs its output via the buffer 24L as a clock PCLK.

Although the comparison circuits 44 and 45 are similarly configured, and the potentials OUTP and OUTM of the I-V converter 22 are input to both of the comparison circuits 44 and 45, the potentials OUTP and OUTM are coupled in the opposite manner in the comparison circuit 44 and the comparison circuit 45.

As shown in FIG. 4, the amount of the difference between the drive current IDR and the drive current IDRB becomes Id and 2*Id alternately every period T. In order to recover a clock, it is sufficient to detect that either current of the drive current IDR or the drive current IDRB is larger than Id. In other words, what is needed is to set the reference voltage REF to a potential difference between the potentials OUTP and OUTM when the amount of the drive current IDR or IDRB is between Id and 2*Id, and then, to determine whether either one of the potential difference OUTP−OUTM or OUTM−OUTP has or has not exceeded the reference voltage REF. Therefore, by performing a logical OR operation on the outputs of the comparison circuits 44 and 45, the comparator 24 substantially compares an absolute value of the potential difference output from the I-V converter 22 with the reference voltage REF, and then outputs its result as the clock PCLK.

Second Embodiment

Figure 9:
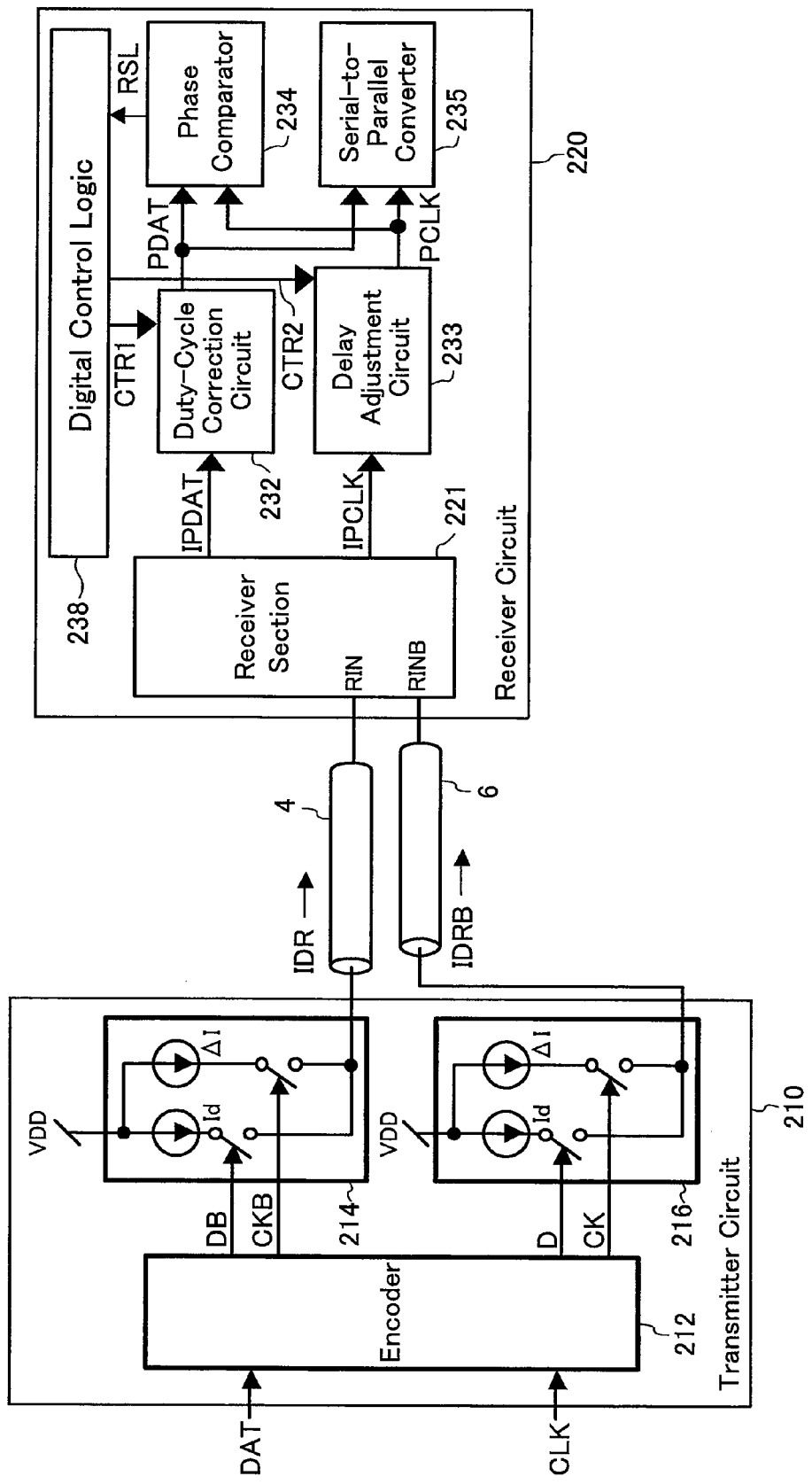
FIG. 9 is a block diagram illustrating a configuration of a data transmission system in accordance with the second embodiment of the present invention.

FIG. 9 is a block diagram illustrating a configuration of a data transmission system in accordance with the second embodiment of the present invention. The data transmission system of FIG. 9 includes a transmitter circuit 210 which transmits data, transmission lines 4 and 6 which transmit the transmitted data, and a receiver circuit 220 which receives the data transmitted through the transmission lines 4 and 6.

The transmitter circuit 210 includes an encoder 212, a positive driver 214, and a negative driver 216. The encoder 212 generates and outputs control signals which control the drivers 214 and 216, according to a data signal DAT and a clock CLK which were input. The drivers 214 and 216 each includes a current source which provides a current Id, and a current source which provides a current ΔI. The drivers 214 and 216 respectively control drive currents IDR and IDRB which flow through the transmission lines 4 and 6, according to the control signals output from the encoder 212. That is, the transmitter circuit 210 controls the drive currents IDR and IDRB to be one of three levels (0, Id, and Id+ΔI) according to the data signal DAT and the clock CLK.

Figure 10:
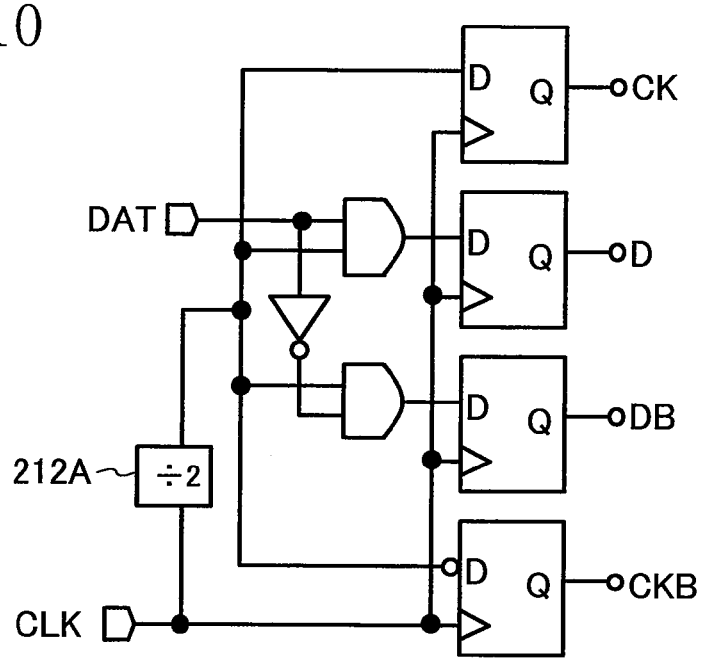
FIG. 10 is a circuit diagram illustrating a configuration of the encoder of FIG. 9.

FIG. 10 is a circuit diagram illustrating a configuration of the encoder 212 of FIG. 9. The encoder 212 includes a frequency divider 212A, four D flip-flips, and logical gates. The frequency divider 212A divides the frequency of the clock CLK by two. The encoder 212 outputs the signal of which frequency is divided by two and an inverted signal thereof as control signals CK and CKB, respectively. When the signal of which frequency is divided by two is in an "H" state, the encoder 212 outputs the data signal DAT and the inverted signal thereof as control signals D and DB, respectively. The encoder 212 outputs the control signals D, DB, CK, and CKB in synchronization with the clock CLK.

Figure 11:
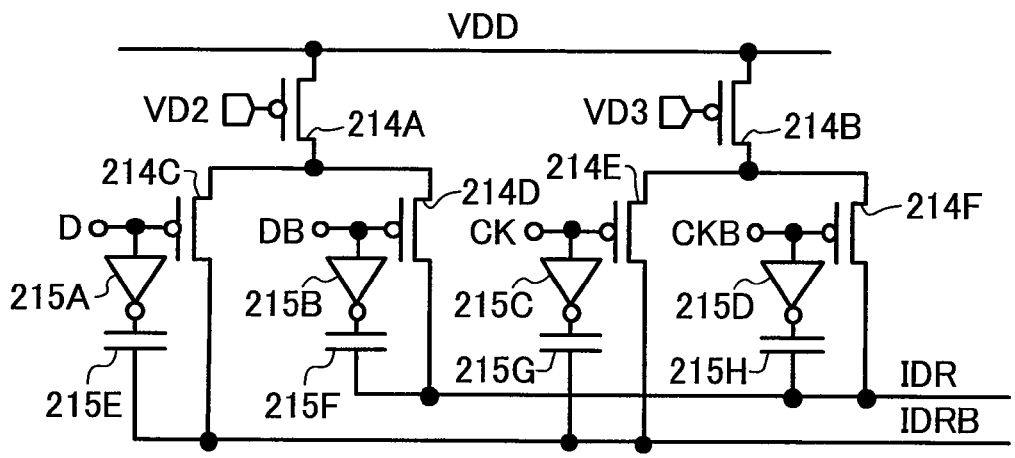
FIG. 11 is a circuit diagram collectively illustrating configurations of the two drivers of FIG. 9.

FIG. 11 is a circuit diagram collectively illustrating configurations of the two drivers 214 and 216 of FIG. 9. The drivers of FIG. 11 includes PMOS transistors 214A and 214B, to which bias potentials VD2 and VD3 are applied respectively, which operate as current sources, PMOS transistors 214C and 214D which respectively switch a current from the transistor 214A according to the control signals D and DB, and PMOS transistors 214E and 214F which respectively switch a current from the transistor 214B according to the control signals CK and CKB. The transistors 214A and 214B conduct nearly constant currents ΔI and Id, respectively.

In addition, the drivers of FIG. 11 include an inverter 215A and a capacitor 215E connected in series between the gate and the drain of the transistor 214C. Similarly, the drivers of FIG. 11 include an inverter 215B and a capacitor 215F between the gate and the drain of the transistor 214D, an inverter 215C and a capacitor 215G between the gate and the drain of the transistor 214E, and an inverter 215D and a capacitor 215H between the gate and the drain of the transistor 214F.

Therefore, when changing the drive currents IDR and IDRB to be allowed to flow through the transmission lines 4 and 6, the drivers of FIG. 11 can add currents to the drive currents IDR and IDRB by the inverters 215A to 215D and the capacitors 215E to 21511. For example, the drivers of FIG. 11 increase the drive currents IDR and IDRB instantaneously according to a transition of the value of a control signal. As a result, since the currents increase only when the drive currents IDR and IDRB change, a state of so-called pre-emphasis can be set. Accordingly, relatively easy addition in circuits, that is, basically only addition of capacitors and inverters, can mitigate the effects of inter-symbol interference, thereby allowing the duty cycle of a recovered clock to approach a more ideal value. In addition, the use of capacitors makes the circuit configuration very simple.

Figure 12:
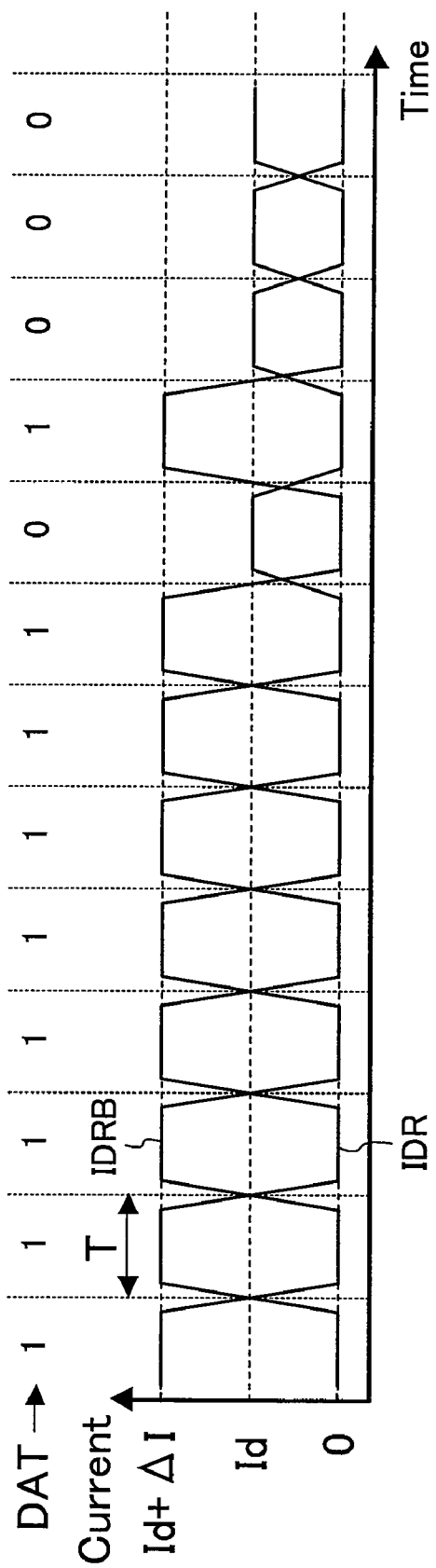
FIG. 12 is a graph illustrating an example of the drive currents which flow through the transmission lines in the data transmission system of FIG. 9.

FIG. 12 is a graph illustrating an example of the drive currents IDR and IDRB which flow through the transmission lines 4 and 6 in the data transmission system of FIG. 9. FIG. 13 is a figure showing a relationship between the value of the data signal DAT and the drive currents IDR and IDRB in the data transmission system of FIG. 9. As shown in FIG. 12, the drive current IDR and the drive current IDRB flow alternately every period T of the clock CLK.

In addition, when the data signal DAT=1, a current Id+ΔI flows as the drive current IDR or IDRB, and when the data signal DAT=0, a current Id flows as the drive current IDR or IDRB. As shown in FIG. 12, since the data signal and the clock are superimposed on the drive currents IDR and IDRB, which are transmitted through the transmission lines 4 and 6, the clock can be recovered in the receiver circuit 220. When transmitting a signal as shown in FIG. 12, since the clock is recovered based on the drive currents IDR and IDRB whose values change each time, the recovered clock is not susceptible to inter-symbol interference, thereby allowing its duty cycle to approach a more ideal value.

The receiver circuit 220 of FIG. 9 includes a receiver section 221, a duty-cycle correction circuit 232, a delay adjustment circuit 233, a phase comparator 234, a serial-to-parallel converter 235, and a digital control logic 238. The digital control logic 238 generates control codes CTRL and CTR2, and outputs them to the duty-cycle correction circuit 232 and to a delay adjustment circuit 233. The serial-to-parallel converter 235 is similar to the circuit which is configured with the D flip-flops 26 and 27 of FIG. 1.

Figure 14:
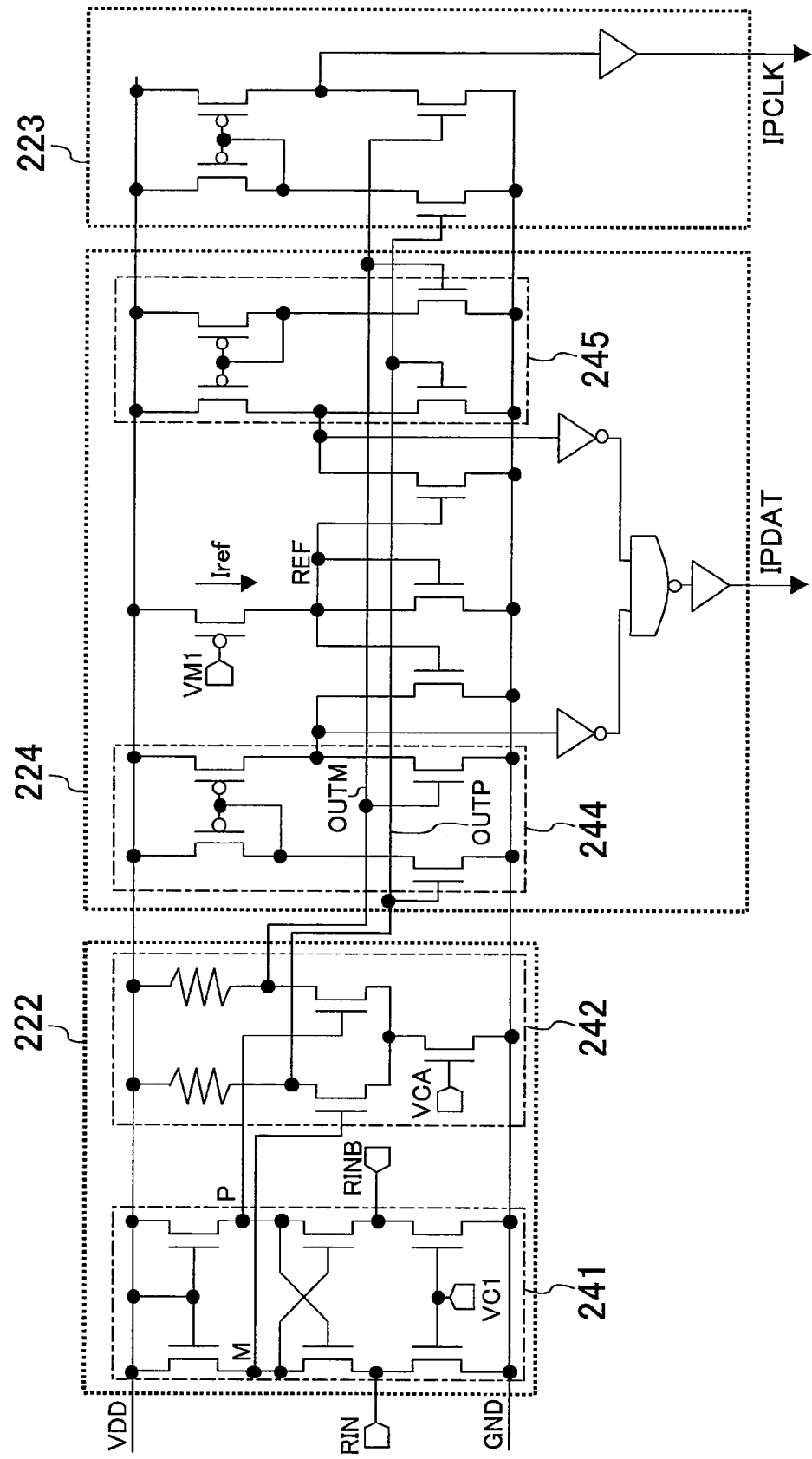
FIG. 14 is a circuit diagram illustrating an example configuration of the receiver section of FIG. 9.

FIG. 14 is a circuit diagram illustrating an example configuration of the receiver section 221 of FIG. 9. The receiver section 221 includes an I-V converter 222, an amplifier 223 as a clock recovery circuit, and a comparator 224 as a data recovery circuit.

The I-V converter 222 includes an I-V conversion section 241 and an amplifier 242. The I-V conversion section 241, which is the circuit of FIG. 7, converts the drive currents IDR and IDRB to potentials P and M, and outputs them. The amplifier 242 amplifies a potential difference between the potentials P and M, and outputs the obtained potentials OUTP and OUTM to the amplifier 223 and the comparator 224. The amplifier 223 amplifies a potential difference between the potentials OUTP and OUTM, and outputs its result as a clock IPCLK via a buffer.

The comparator 224 includes comparison circuits 244 and 245 which are similar to the comparison circuits 44 and 45 of FIG. 8, compares an absolute value of the potential difference between the potentials OUTP and OUTM with the reference voltage REF, and then outputs its comparison result as a data signal IPDAT. In order that a case where the amount of the drive current IDR or IDRB is Id and a case where it is Id+ΔI can be differentiated, a bias potential VM1 is applied to the comparator 224. With respect to the other aspects, the comparator 224 is almost identical to the comparator 24 of FIG. 8.

Figure 15:
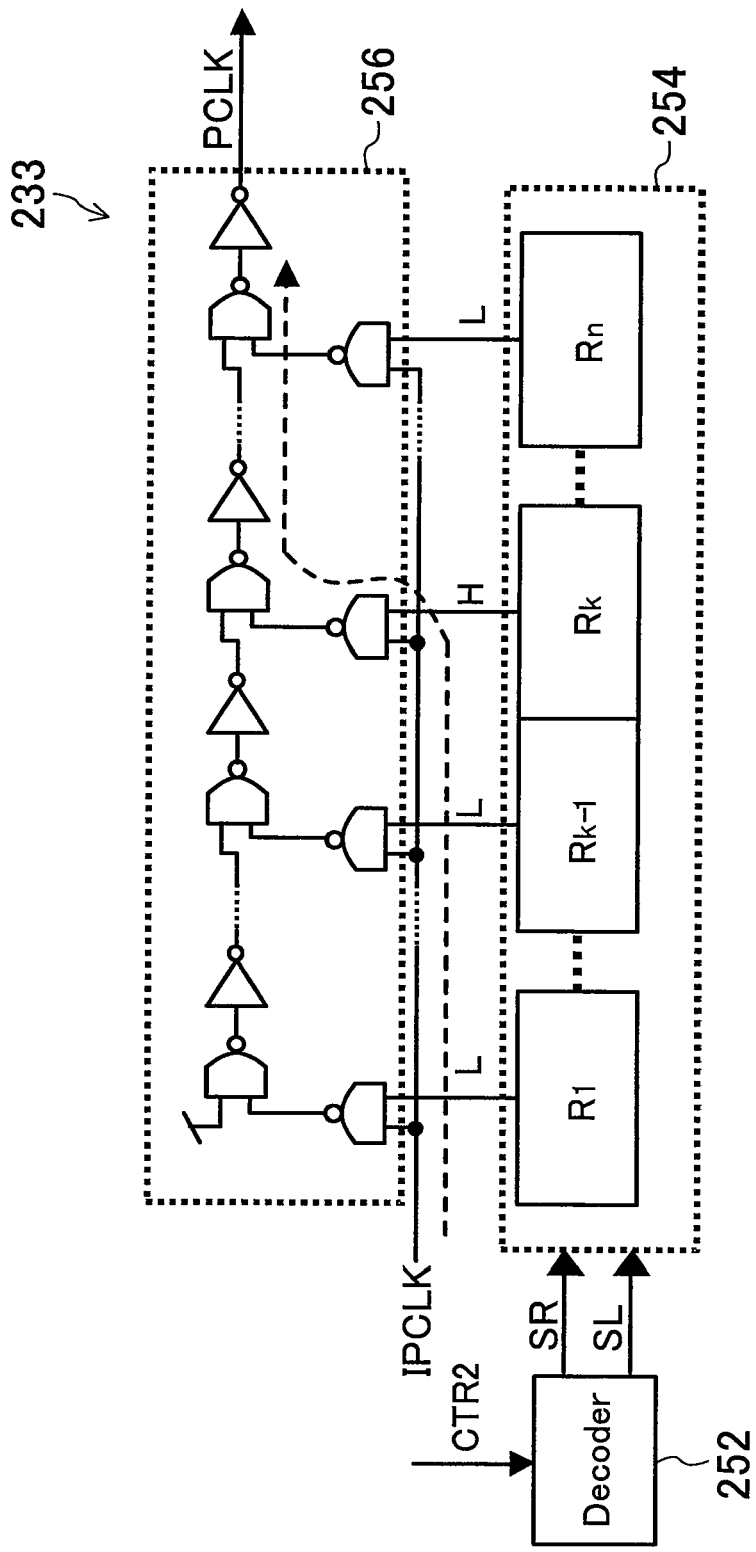
FIG. 15 is a block diagram illustrating an example configuration of the delay adjustment circuit of FIG. 9.

FIG. 15 is a block diagram illustrating an example configuration of the delay adjustment circuit 233 of FIG. 9. The delay adjustment circuit 233 includes a decoder 252, a shift register 254, and a variable delay line 256. The decoder 252 generates shift signals SR and SL according to the control code CTR2. The shift register 254 performs a right or left bit shift of a specified number of bits on a predetermined value according to the shift signal SR or SL, and outputs the shifted value. The variable delay line 256 delays the clock IPCLK according to the value of each bit which is output from the shift register 254, and outputs the delayed clock as a clock PCLK.

The clock IPCLK propagates through a gate to which "H" is applied from the shift register 254 as shown with the dashed arrowed line in FIG. 15. Thus, the delay adjustment circuit 233 introduces a delay to the input signal according to the control code CTR2, and outputs the delayed input signal.

Figure 16:
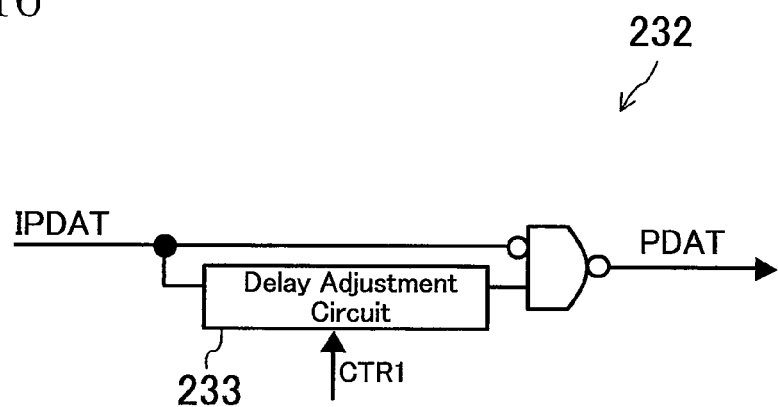
FIG. 16 is a block diagram illustrating an example configuration of the duty-cycle correction circuit of FIG. 9.

FIG. 16 is a block diagram illustrating an example configuration of the duty-cycle correction circuit 232 of FIG. 9. The duty-cycle correction circuit 232 includes the delay adjustment circuit 233 of FIG. 15, and the control code CTR1 is provided to the delay adjustment circuit 233. The delay adjustment circuit 233 corrects the duty cycle of the data signal IPDAT according to the control code CTR1, and outputs the corrected data signal as the data signal PDAT.

Figure 17:
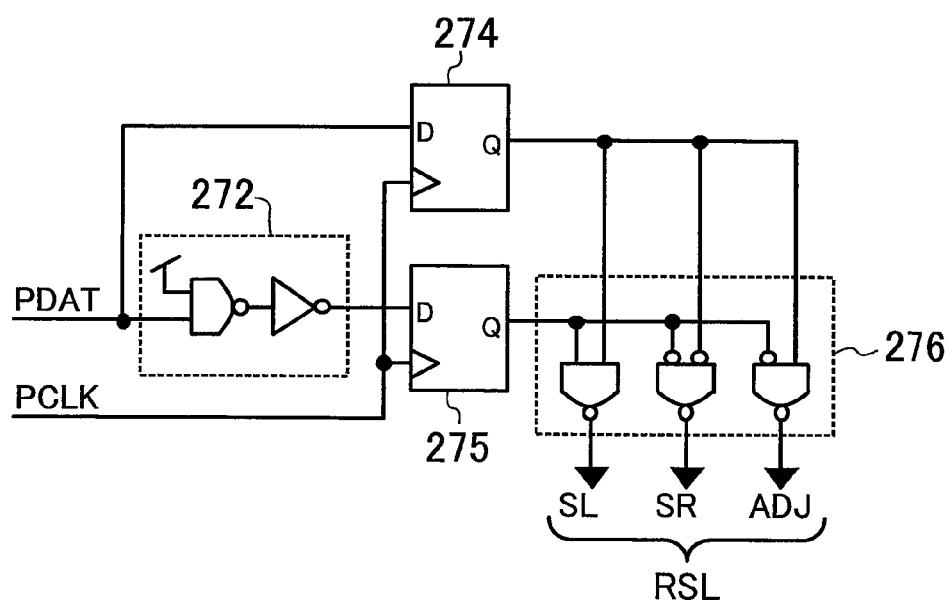
FIG. 17 is a block diagram illustrating an example configuration of the phase comparator of FIG. 9.

FIG. 17 is a block diagram illustrating an example configuration of the phase comparator 234 of FIG. 9. The phase comparator 234 includes a unit delay circuit 272, D flip-flops 274 and 275, and a phase comparator 276.

The unit delay circuit 272 applies a unit delay (here, a minimum gate delay to provide positive logic) to the data signal PDAT, and outputs the delayed signal. The D flip-flops 274 and 275 latch the data signal PDAT and the output of the unit delay circuit 272, respectively, in synchronization with the clock PCLK. The phase comparator 276 determines the phase relationship between the data signal PDAT and the clock PCLK using the latched data, and outputs its determination result RSL (a determination result ADJ, SR, or SL) to the digital control logic 238. The digital control logic 238 generates the control code CTRL and CTR2 according to the determination result RSL.

When the latch results of the D flip-flops 274 and 275 do not match, an edge of the clock PCLK exists between an edge of the data signal PDAT and an edge of the delayed data signal. In such a case, the phase comparator 276 determines that the phases are close, and sets the determination result ADJ to "H." In addition, when the latch results of the D flip-flops 274 and 275 are both "L" (low potential), the phase comparator 276 determines that the clock PCLK is ahead of the data signal PDAT, and sets the determination result SR to "H" in order to advance the data signal PDAT. When the latch results of the D flip-flops 274 and 275 are both "H," the phase comparator 276 determines that the clock PCLK is behind the data signal PDAT, and sets the determination result SL to "H" in order to delay the data signal PDAT.

Figure 18:
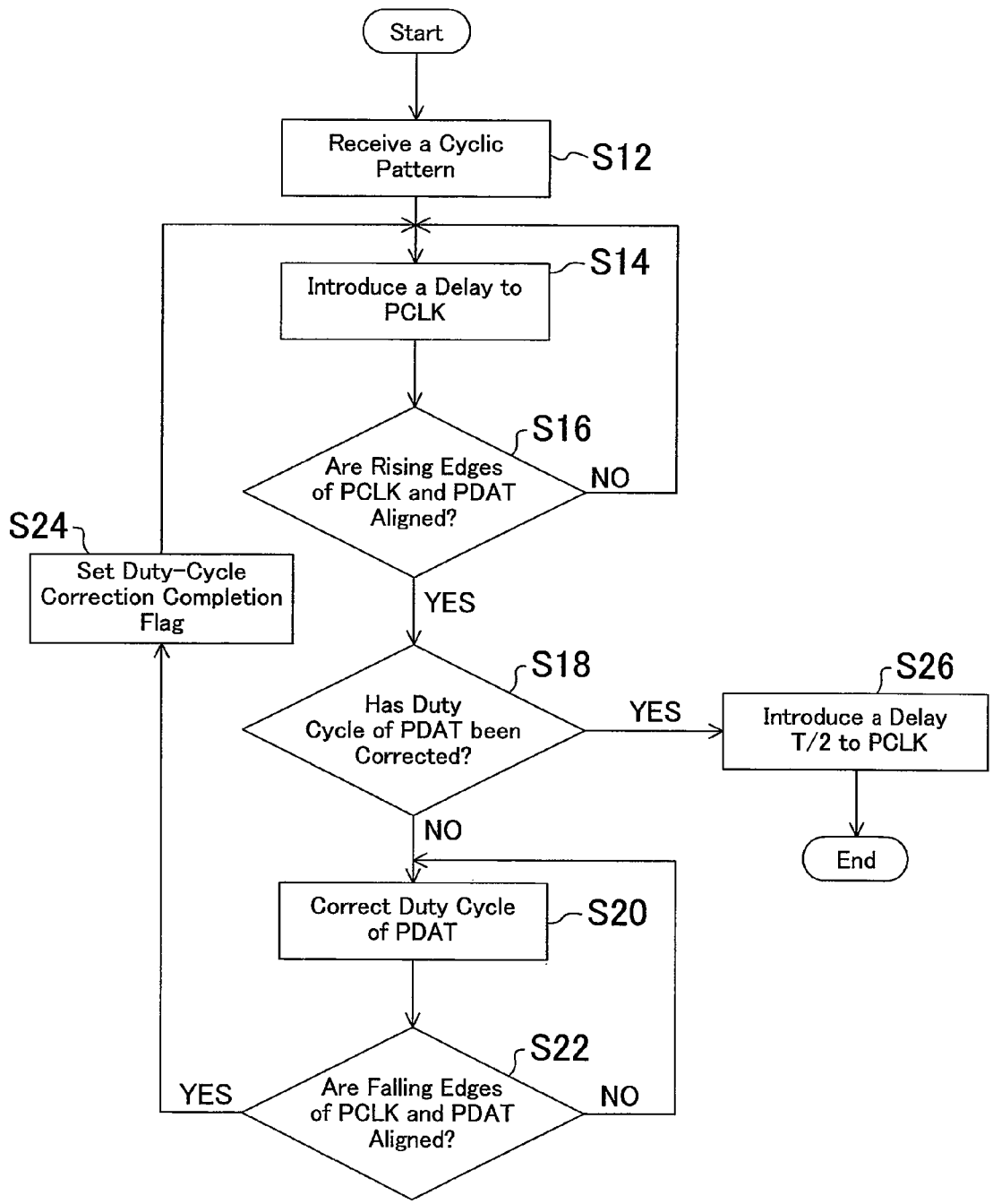
FIG. 18 is a flowchart illustrating a process in the receiver circuit of FIG. 9.

FIG. 18 is a flowchart illustrating a process in the receiver circuit 220 of FIG. 9. At step S12 of FIG. 18, the receiver section 221 receives a cyclic pattern in which "0" and "1" are repeated. At step S14, the delay adjustment circuit 233 introduces a delay to the clock IPCLK.

At step S16, the phase comparator 276 determines whether a rising edge of the data signal IPDAT and a rising edge of the clock IPCLK are aligned or not. At this point, if a time difference between the two compared edges are within a predetermined range (e.g., a determination result ADJ of the phase comparator 276 is "H"), the phase comparator 276 determines that the two edges are aligned. If it is determined that the edges are not aligned, the process returns to step S14, and a delay is further introduced to the clock IPCLK. If it is determined that the edges are aligned, the process proceeds to step S18.

At step S18, the digital control logic 238 determines whether the duty cycle of the data signal IPDAT has been corrected or not by means of a duty-cycle correction completion flag. If it has been corrected, the process proceeds to step S26. If it has not been corrected, the process proceeds to step S20.

At step S20, the duty-cycle correction circuit 232 performs a duty cycle correction on the data signal IPDAT. At step S22, the phase comparator 276 determines whether a falling edge of the data signal IPDAT and a falling edge of the clock IPCLK are aligned or not. If it is determined that the edges are not aligned, the process returns to step S20, and a duty cycle correction is further performed on the data signal IPDAT. If it is determined that the edges are aligned, the process proceeds to step S24.

At step S24, the digital control logic 238 sets the duty-cycle correction completion flag. Thereafter, the process returns to step S14. At step S14, the delay adjustment circuit 233 introduces a delay to the clock IPCLK, and at step S16, the phase comparator 276 determines whether a rising edge of the data signal IPDAT and a rising edge of the clock IPCLK are aligned or not. By steps S14 and S16, a delay corresponding to a unit interval T is further introduced to the clock IPCLK.

Thereafter, since the duty cycle correction has already been performed, the process proceeds from step S18 to step S26. At step S26, the digital control logic 238 calculates a control code CTR2 which causes the clock IPCLK to be delayed by T/2 with respect to the data signal IPDAT, from the control code CTR2 when it is determined that the edges are aligned at step S16 for the first time and the control code CTR2 when it is determined that the edges are aligned at step S16 for the second time. The delay adjustment circuit 233 delays the clock IPCLK according to the calculated control code CTR2.

As described above, by introducing delays to the clock IPCLK and correcting the duty cycle of the data signal IPDAT, a conversion operation in the serial-to-parallel converter 235 can be performed accurately.

According to the above-mentioned process, since the duty cycle of a data signal is corrected according to a recovered clock, quality of the clock and the data signal can be improved, and a data transmission speed can be increased. Moreover, since the delay adjustment circuit adjusts the phase of the recovered clock after a duty cycle correction, the phase between the clock and the data signal can be adjusted under a condition where the duty cycle has been corrected, and the data transmission speed can be further increased.

Figure 19:
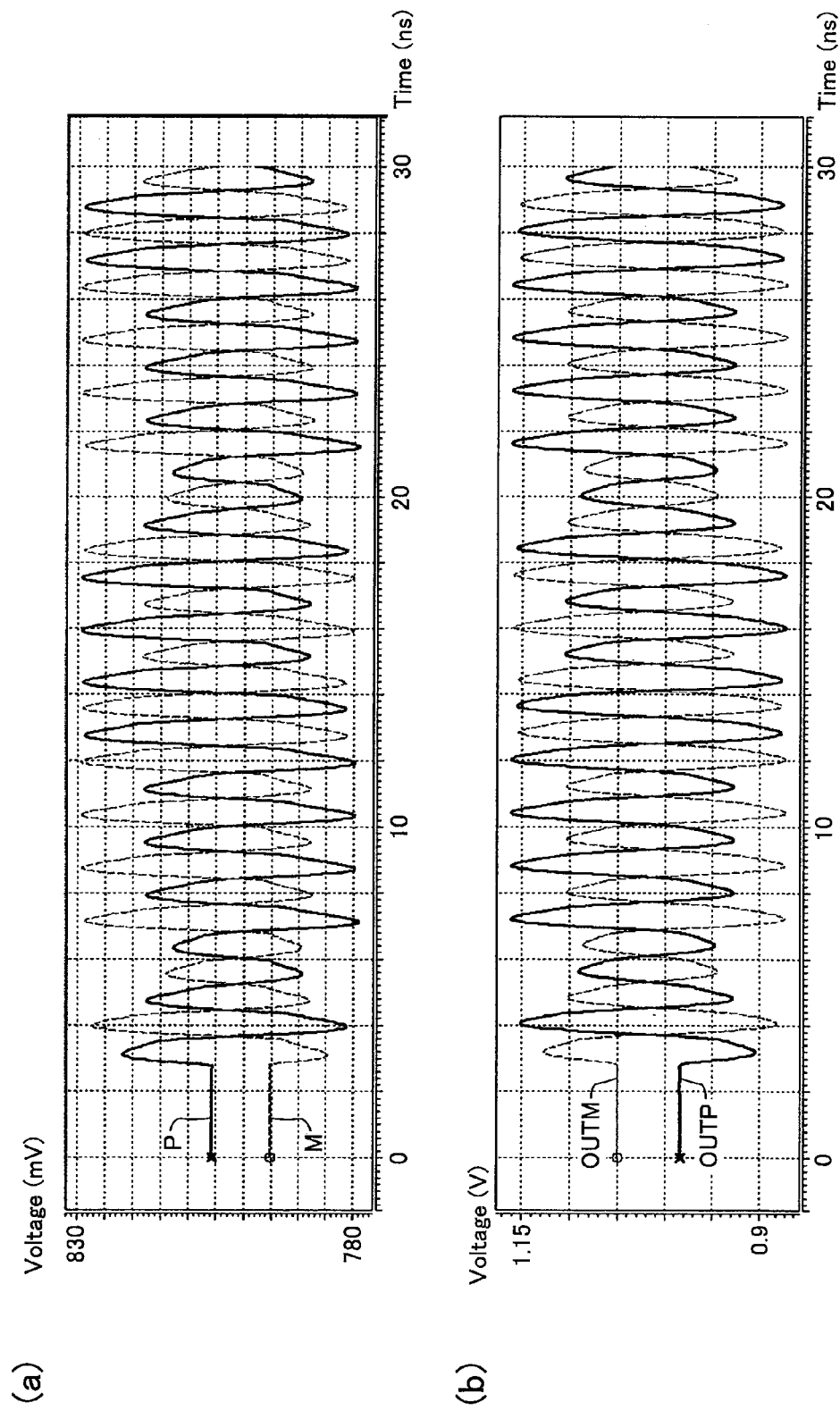
FIG. 19($a$) is a graph illustrating the output potentials M and P of the I-V converter section of FIG. 14.
Figure 20:
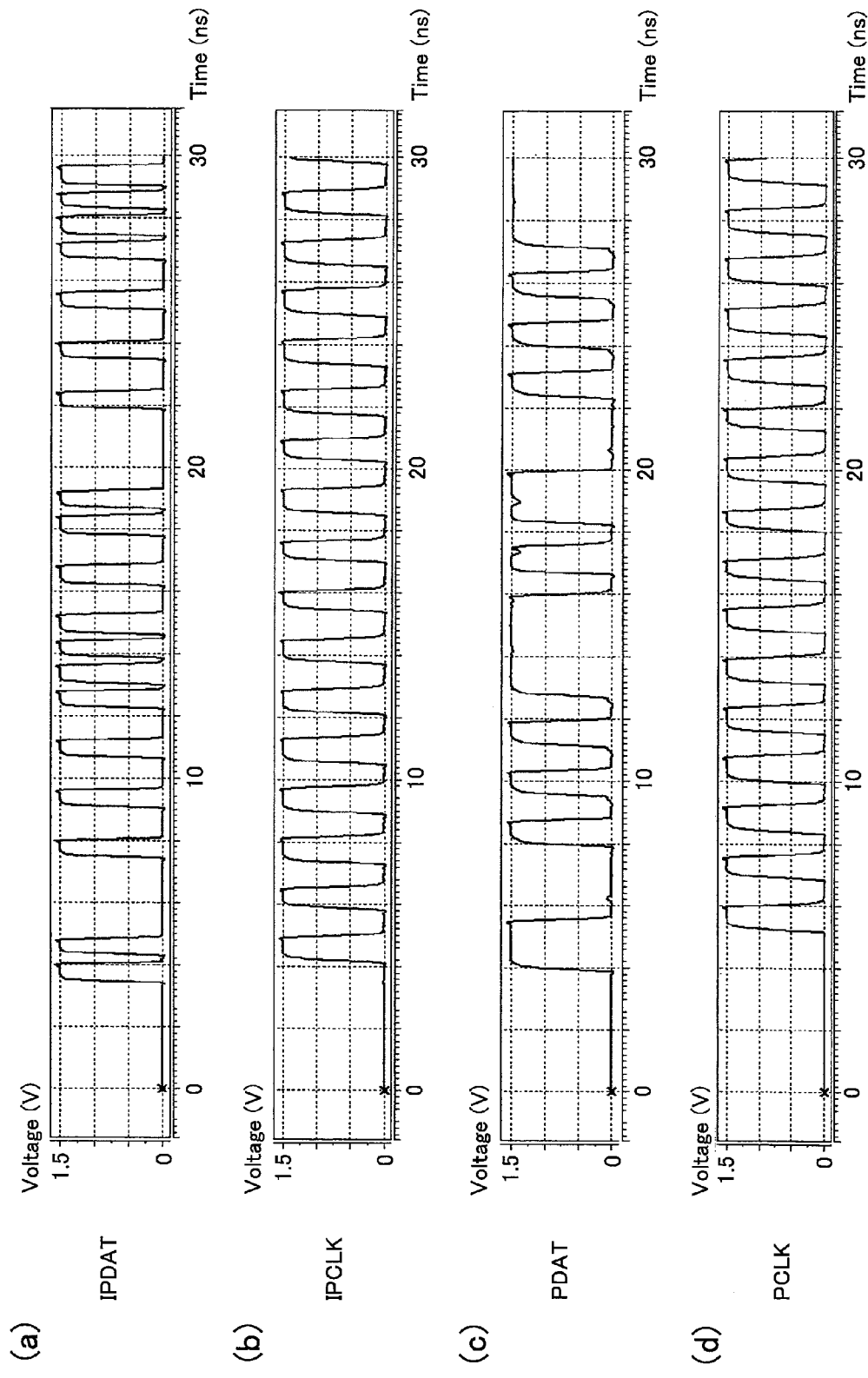
FIGS. 20($a$) and 20($b$) are graphs respectively illustrating the data signal IPDAT and the clock IPCLK output from the receiver section of FIG. 9.

FIG. 19(a) is a graph illustrating the output potentials M and P of the I-V converter section 241 of FIG. 14. FIG. 19(b) is a graph illustrating the output potentials OUTM and OUTP of the amplifier 242 of FIG. 14. FIGS. 20(a) and 20(b) are graphs respectively illustrating the data signal IPDAT and the clock IPCLK output from the receiver section 221 of FIG. 9. FIGS. 20(c) and 20(d) are graphs respectively illustrating the data signal PDAT output from the duty-cycle correction circuit 232 of FIG. 9, and the clock PCLK output from the delay adjustment circuit 233. These graphs are obtained by simulations.

It can be observed that the duty cycle distortion which the data signal IPDAT in FIG. 20(a) includes has been corrected in the data signal PDAT in FIG. 20(c). Moreover, since delay adjustment has been performed, it can be seen that the edges of the data signal PDAT in FIG. 20(c) are located near the centers of every two adjacent edges of the clock PCLK in FIG. 20(d).

Thus, according to the data transmission system of FIG. 9, since the clock is recovered based on a current whose amount changes every time regardless of the transmitted data signal, the recovered clock is not susceptible to inter-symbol interference, thereby allowing the duty cycle of the clock to approach a more ideal value. In addition, since the duty cycle of the recovered data signal is adjusted on the basis of this clock, quality of the clock and the data signal can be improved. Therefore, the data transmission speed can be increased compared to that of the data transmission system of FIG. 1 without largely increasing current consumption.

Next, a data transmission system which uses only a single transmission line is described below. This is different from the data transmission system of FIG. 1 or FIG. 9 in that the drivers and the I-V converter are changed as follows, and that only a single transmission line is used. Although, in the embodiments described above, cases involving two transmission lines are described, a single transmission line would be sufficient to conduct communication.

Figure 21:
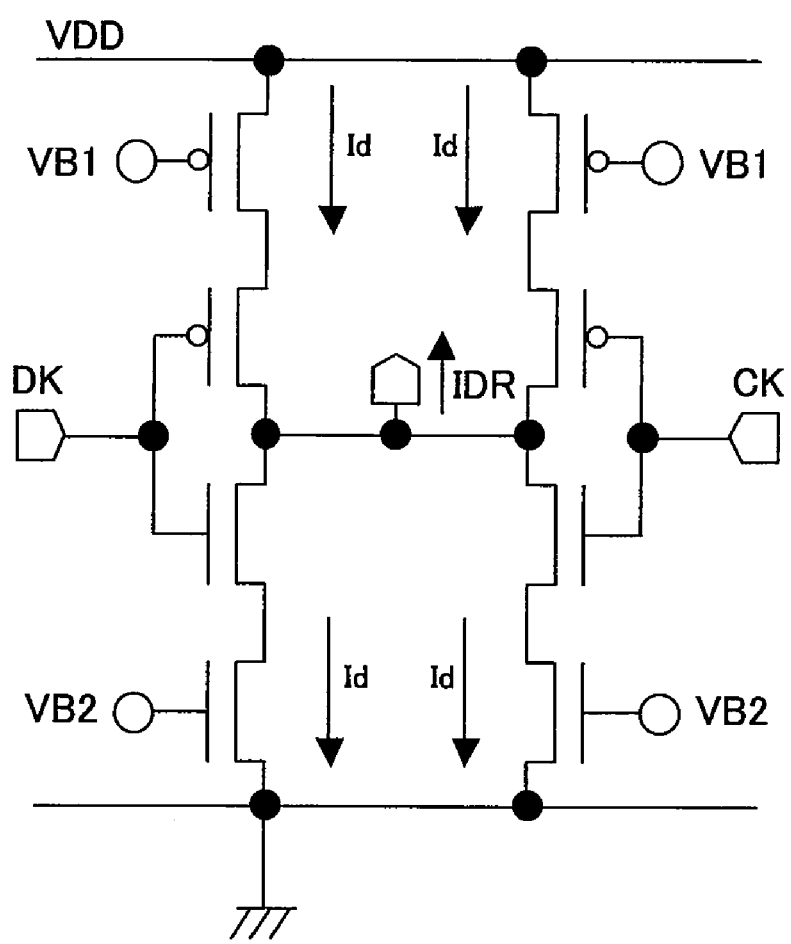
FIG. 21 is a circuit diagram illustrating a configuration of a driver in a data transmission system which uses only a single transmission line.
Figure 22:
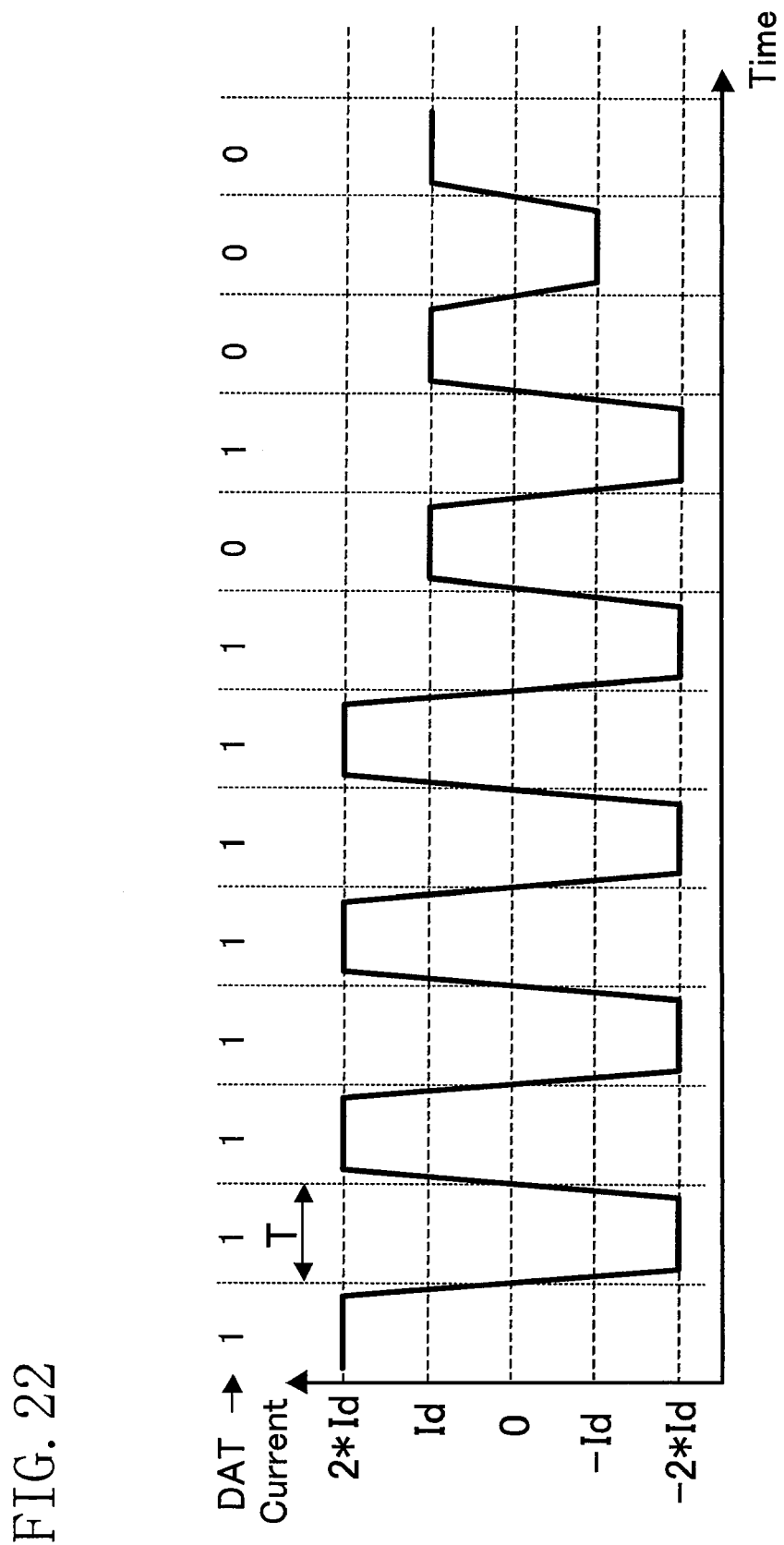
FIG. 22 is a graph illustrating an example of the drive current which flows through a transmission line in a data transmission system which uses only the single transmission line.

FIG. 21 is a circuit diagram illustrating a configuration of a driver in a data transmission system which uses only a single transmission line. The driver of FIG. 21 performs a push-pull operation according to signals CK and DK based on a clock CLK and a data signal DAT, and allows a drive current IDR to flow through a transmission line. FIG. 22 is a graph illustrating an example of the drive current IDR which flows through the transmission line in a data transmission system which uses only the single transmission line. By forming the waveform of the drive current IDR as shown in FIG. 22, a data signal can be transmitted by whether the amount of the current is large or small, and a clock can be transmitted by the direction of the current.

Figure 23:
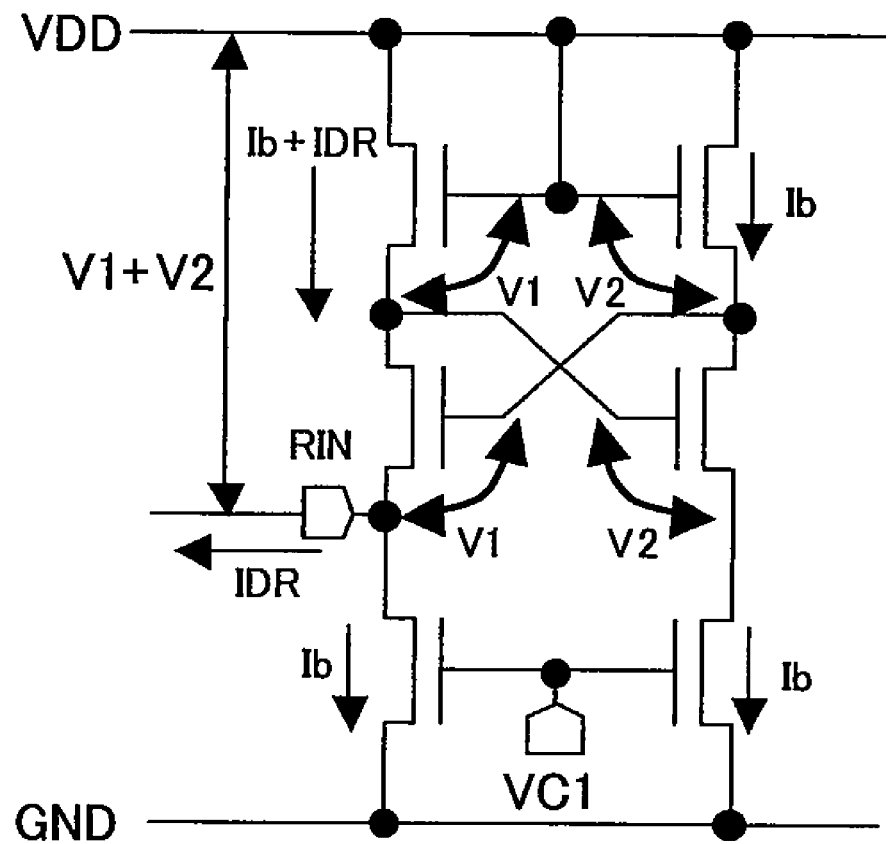
FIG. 23 is a circuit diagram illustrating an example configuration of a main portion of an I-V converter in a data transmission system which uses only a single transmission line.

FIG. 23 is a circuit diagram illustrating an example configuration of a main portion of an I-V converter in a data transmission system which uses only a single transmission line. The circuit of FIG. 23 is configured almost identically to the circuit of FIG. 7 except that only a single transmission line is connected. By using only a single transmission line as this, the number of the transmission lines required to be connected is reduced, then the configuration of a data transmission system is simplified.

INDUSTRIAL APPLICABILITY

As described above, the present invention is useful in data transmission systems, etc., since the voltage amplitude of a transmission line can be suppressed.

The invention claimed is:

1. A receiver circuit connectable to a first and a second transmission lines which transmit information by using currents, the receiver circuit comprising:
a first current source and a second current source;
a first conversion circuit configured to convert a current which flows the first conversion circuit to a first voltage;
a second conversion circuit configured to convert a current which flows the second conversion circuit to a second voltage;
a first transistor whose source is coupled to the first current source and connectable to the first transmission line, and whose drain is coupled to the first conversion section, the first transistor being configured to receive, at the source thereof, a current supplied from the first current source;
a second transistor whose source is coupled to the second current source and connectable to the second transmission line, and whose drain is coupled to the second conversion section, the second transistor being configured to receive, at the source thereof, a current supplied from the second current source;
a data recovery circuit configured to receive the first voltage converted by the first conversion circuit and the second voltage converted by the second conversion circuit; and
a clock recovery circuit configured to receive the first voltage converted by the first conversion circuit and the second voltage converted by the second conversion circuit, wherein:
the gate of the first transistor is coupled to the drain of the second transistor,
the drain of the first transistor is coupled to the gate of the second transistor,
the currents which flow through the first and the second transmission lines transmit a data signal and a clock which are superimposed thereon,
a frequency of the clock is one half of a transmission frequency of the data signal,
the data recovery circuit is configured to recover the transmitted data signal according to the first and second voltages, and
the clock recovery circuit is configured to recover the transmitted clock according to the first and second voltages.

2. The receiver circuit of claim 1, further comprising:
a duty-cycle correction circuit configured to correct a duty cycle of the data signal recovered by the data recovery circuit according to the clock recovered by the clock recovery circuit.

3. The receiver circuit of claim 2, further comprising:
a delay adjustment circuit configured to adjust a phase of the recovered clock,
wherein the delay adjustment circuit adjusts the phase of the recovered clock after the duty cycle is corrected by the duty-cycle correction.

4. The receiver circuit of claim 1, further comprising:
a delay adjustment circuit configured to adjust a phase of the recovered clock.

5. The receiver circuit of claim 1, further comprising:
a serial-to-parallel converter configured to receive the recovered data signal from the data recovery circuit, to convert the received recovered data signal into parallel signals, and to output the parallel signals.

6. The receiver circuit of claim 5, wherein the serial-to-parallel converter is configured to receive the recovered clock from the clock recovery circuit.

7. A data transmission system comprising:
a transmitter circuit configured to drive a first and a second transmission lines with currents; and
a receiver circuit coupled to the first and the second transmission lines, wherein:
the transmitter circuit superimposes a data signal and a clock on the currents which flow through the first and the second transmission lines, and transmits the superimposed data signal and clock, and
the receiver circuit includes:
a first current source and a second current source;
a first conversion circuit configured to convert a current which flows the first conversion circuit to a first voltage;
a second conversion circuit configured to convert a current which flows the second conversion circuit to a second voltage;
a first transistor whose source is coupled to the first current source and to the first transmission line, and whose drain is coupled to the first conversion section, the first transistor being configured to receive, at the source thereof, a current supplied from the first current source;
a second transistor whose source is coupled to the second current source and to the second transmission line, and whose drain is coupled to the second conversion section, the second transistor being configured to receive, at the source thereof, a current supplied from the second current source;
a data recovery circuit configured to receive the first voltage converted by the first conversion circuit and the second voltage converted by the second conversion circuit; and
a clock recovery circuit configured to receive the first voltage converted by the first conversion circuit and the second voltage converted by the second conversion circuit, wherein:

the gate of the first transistor is coupled to the drain of the second transistor, the drain of the first transistor is coupled to the gate of the second transistor, the data recovery circuit is configured to recover the transmitted data signal according to the first and second voltages, and the clock recovery circuit is configured to recover the transmitted clock according to the first and second voltages.

8. The data transmission system of claim 7, wherein the transmitter circuit transmits the data signal depending on which of the first and the second transmission lines the transmitter circuit allows a current to flow through, and the clock by changing the value of the current on the first or the second transmission line through which the current flows.

9. The data transmission system of claim 7, wherein the transmitter circuit transmits the clock by allowing a current to flow through the first and the second transmission lines alternately, and the data signal corresponding to the value of the current on the first or the second transmission line through which the current flows.

10. The data transmission system of claim 7, wherein the transmitter circuit includes a circuit configured to add a current to one of the currents which the transmitter circuit allows to flow through the first and the second transmission lines when the amount of the one of the currents is changed.

11. The data transmission system of claim 10, wherein the circuit configured to add the current includes one or more capacitors.

12. The data transmission system of claim 7, wherein a frequency of the clock is one half of a transmission frequency of the data signal.

13. The data transmission system of claim 7, wherein the receiver circuit further including:

a serial-to-parallel converter configured to receive the recovered data signal from the data recovery circuit, to convert the received recovered data signal into parallel signals, and to output the parallel signals.

14. The data transmission system of claim 13, wherein the serial-to-parallel converter is configured to receive the recovered clock from the clock recovery circuit.

15. The data transmission system of claim 7, wherein the receiver circuit further including:

a duty-cycle correction circuit configured to correct a duty cycle of the data signal recovered by the data recovery circuit according to the clock recovered by the clock recovery circuit.

16. The data transmission system of claim 15, wherein:

the receiver circuit further including:

a delay adjustment circuit configured to adjust a phase of the recovered clock, and the delay adjustment circuit adjusts the phase of the recovered clock after the duty cycle is corrected by the duty-cycle correction.

17. The data transmission system of claim 7, wherein the receiver circuit further including:

a delay adjustment circuit configured to adjust a phase of the recovered clock.

* * * * *